United States Patent
Bieling et al.

(10) Patent No.: US 10,018,917 B2
(45) Date of Patent: Jul. 10, 2018

(54) ILLUMINATION OPTICAL UNIT FOR EUV PROJECTION LITHOGRAPHY

(71) Applicant: Carl Zeiss SMT GmbH, Oberkochen (DE)

(72) Inventors: Stig Bieling, Aalen (DE); Martin Endres, Koenigsbronn (DE); Markus Deguenther, Aalen (DE); Michael Patra, Oberkochen (DE); Johannes Wangler, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/435,851

(22) Filed: Feb. 17, 2017

(65) Prior Publication Data

US 2017/0160642 A1 Jun. 8, 2017

Related U.S. Application Data

(63) Continuation of application No. PCT/EP2015/069038, filed on Aug. 19, 2015.

(30) Foreign Application Priority Data

Aug. 25, 2014 (DE) ........................ 10 2014 216 802

(51) Int. Cl.
*G02B 5/08* (2006.01)
*G03B 27/54* (2006.01)
*G03F 7/20* (2006.01)

(52) U.S. Cl.
CPC .......... *G03F 7/70075* (2013.01); *G03F 7/702* (2013.01); *G03F 7/70033* (2013.01); *G03F 7/70233* (2013.01)

(58) Field of Classification Search
CPC .. G03F 7/70033; G03F 7/70075; G03F 7/702; G03F 7/70233
(Continued)

(56) References Cited

U.S. PATENT DOCUMENTS

| | | | |
|---|---|---|---|
| 2009/0015812 A1* | 1/2009 | Schultz | B82Y 10/00 355/67 |
| 2011/0001947 A1 | 1/2011 | Dinger et al. | |

(Continued)

FOREIGN PATENT DOCUMENTS

| | | |
|---|---|---|
| DE | 10 2008 009 600 A1 | 8/2009 |
| DE | 10 2012 206 612 A1 | 10/2013 |

(Continued)

OTHER PUBLICATIONS

German Office Action, with translation thereof, for corresponding DE Appl No. 10 2014 216 802.3, dated Feb. 13, 2015.
(Continued)

*Primary Examiner* — Colin Kreutzer
(74) *Attorney, Agent, or Firm* — Fish & Richardson P.C.

(57) ABSTRACT

An illumination optical unit for EUV projection lithography illuminates an object field, in which an object to be imaged is arrangeable. A first facet mirror of the illumination optical unit generates secondary light sources as images of an upstream light source. The first facet mirror includes mirrors which include a mirror surface smaller than 2 mm×2 mm. The first facet mirror is a distance |g| from the light source. The illumination optical unit includes a second facet mirror. The two facet mirrors are a distance b' from each other. The individual mirrors of the first facet mirror have a focal length f in a plane of incidence of the illumination light on the individual mirrors such that $[0.1 \, b'g/(g-b')] < f < [10 \, b'g/(g-b')]$.

19 Claims, 5 Drawing Sheets

(58) Field of Classification Search
USPC .......................................... 355/67; 359/855
See application file for complete search history.

(56) References Cited

U.S. PATENT DOCUMENTS

2012/0262688 A1    10/2012  De Vries et al.
2015/0092174 A1     4/2015  Endres et al.

FOREIGN PATENT DOCUMENTS

DE     10 2012 212 453 A1    1/2014
WO     WO 2009/100856 A1     8/2009
WO     WO 2010/099807 A1     9/2010
WO     WO 2013/160256 A1    10/2013

OTHER PUBLICATIONS

International Search Report for corresponding PCT. Appl No. PCT/EP 2015/069 038, dated Oct. 26, 2015.
"Research Disclosure" Research Disclosure, Mason Publications, Hampshire GB, vol. 592, No. 27, Aug. 1, 2013, p. 3, XP007142402.

* cited by examiner

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2015/069038, filed Aug. 19, 2015, which claims benefit under 35 USC 119 of German Application No. 10 2014 216 802.3, filed Aug. 25, 2014. The entire disclosure of international application PCT/EP2015/069038 and German Application No. 10 2014 216 802.3 are incorporated by reference herein.

FIELD

The disclosure relates to an illumination optical unit for EUV projection lithography for illuminating an object field, in which an object to be imaged is arrangeable. Furthermore, the disclosure relates to an optical system including such an illumination optical unit, an illumination system including such an illumination optical unit, a projection exposure apparatus including such an optical system, a production method using such a projection exposure apparatus and a microstructured or nanostructured component produced by the method.

BACKGROUND

Illumination optical units of the type set forth at the outset are known from WO 2009/100 856 A1 and WO 2010/099 807 A1.

SUMMARY

The disclosure seeks to develop an illumination optical unit of the type set forth at the outset in such a way that an optimized illumination of the second facet mirror and/or of the object field emerges when two facet mirrors are used.

The disclosure provides an illumination optical unit for EUV projection lithography for illuminating an object field, in which an object to be imaged is arrangeable, with illumination light. The unit includes a first facet mirror for imaging generation of secondary light sources as images of an upstream light source having a typical diameter G. The first facet mirror includes a multiplicity of individual mirrors, each including a mirror surface which is smaller than 2 mm×2 mm and has a typical diameter F. The first facet mirror has a distance |g| from the light source. The unit includes a second facet mirror. The two facet mirrors have a distance b' from one another. The individual mirrors of the first facet mirror have a focal length f in a plane of incidence of the illumination light on the individual mirrors of the first facet mirror. The following applies to the focal length:

$$[0.1 \; b'g/(g-b')] < f < [10 \; b'g/(g-b')].$$

What was identified according to the disclosure is that the use of imaging individual mirrors of the first facet mirror, the focal length of which lies within the predetermined range, leads to an advantageously concentrated illumination of the second facet mirror. An advantageously small pupil filling may be realized. Here, the pupil filling is defined as the portion of pupil surface impinged by illumination light in relation to the overall pupil surface. This has as a consequence a correspondingly improved predetermination of desired illumination directions for the object field illumination. Moreover, a good separation of various partial beams of the illumination light, which are guided through the illumination optical unit in such a way that they illuminate the object field from different directions, emerges if the specified condition for the focal length of the individual mirrors of the first facet mirror is observed. The upstream light source, which is imaged into secondary light sources by way of the first facet mirror, may be the light source itself or an image of the light source, for example an intermediate focus disposed downstream of the light source, the intermediate focus, for example, being generated by an illumination light collector which, as a matter of principle, is known from the prior art. The typical diameter of the upstream light source is the diameter of a circle, the area of the circle equaling the source area, i.e. the area of the light source from which the illumination light emanates. The typical diameter of the mirror surface of the individual mirrors of the first facet mirror is the diameter of a circle, the area of the circle equaling the mirror area. The second facet mirror may in turn be constructed from a multiplicity of individual mirrors or micromirrors. However, this is not mandatory. Alternatively, the second facet mirror may also be constructed from macroscopic facets which each guide illumination light, the illumination light being guided to these facets by way of at least one individual mirror group of the first facet mirror.

The reflection surfaces of the individual mirrors of the first facet mirror may be spherical surfaces, aspherical surfaces, cylindrical surfaces, toric surfaces with different radii of curvature in mutually perpendicular planes, ellipsoidal surfaces or superpositions of such surface forms.

In the specified focal length relation, g is an object distance, the value of which may be less than 0. Since a distance is greater than 0 by definition, this distance is the magnitude of g.

In some embodiments, the focal length f deviates from an ideal focal length $f_{opt} = b'g/(g-b')$ by at most a factor of 0.3 $b'G/((b'-g)F)$ and/or by a factor of 750 µm $[g/((g-b')\cdot F)]$. Such focal length conditions were found to be particularly suitable for the design of the individual mirrors of the first facet mirror. A deviation factor in the focal length condition in may also be less than 0.3 $b'G/((b'-g)F)$ and may be, for example, 0.25 $b'G/((b'-g)F)$, 0.2 $b'G/((b'-g)F)$, 0.15 $b'G/((b'-g)F)$ or 0.1 $b'G/((b'-g)F)$. A deviation parameter in the focal length condition may be less than 750 µm $[g/((g-b')\cdot F)]$ and may be, for example, 600 µm $[g/((g-b')\cdot F)]$, 500 µm $[g/((g-b')\cdot F)]$, 400 µm $[g/((g-b')\cdot F)]$, 300 µm $[g/((g-b')\cdot F)]$, 200 µm $[g/((g-b')\cdot F)]$, 150 µm $[g/((g-b')\cdot F)]$, 120 µm $[g/((g-b')\cdot F)]$ or 100 µm $[g/((g-b')\cdot F)]$.

In some embodiments, at least some of the individual mirrors have different radii of curvature in the plane of incidence and/or folding plane on the one hand and, on the other hand, perpendicular to the folding plane, wherein the following applies to the radius of curvature $r_1$ in the folding plane:

$$-20 \; b'g/((g-b')\cos(\alpha/2)) < r_1 < -0.2 \; b'g/((g-b')\cos(\alpha/2)),$$

where α is a folding angle of the illumination light upon reflection at the respective individual mirror of the first facet mirror. Such a radius of curvature condition takes into account the folding of the illumination light when it is reflected at the individual mirrors of the first facet mirror. The folding angle is twice the angle of incidence at the respective individual mirror of the first facet mirror. Here, this may be the mean folding angle of a folding angle range specified by a maximum used actuating angle and a minimum used actuating angle of a tiltable individual mirror.

In Some Embodiments, the Radius of Curvature $r_1$ Deviates from an Ideal Radius of Curvature $$r_{1,opt} = r_1 = \frac{2gb'}{(g-b')\cos(\alpha/2)}$$

by at most the factor of 750 μm [g/((g−b')·F)]. In certain embodiments, the radius of curvature $r_2$ deviates from an ideal radius of curvature $$r_{2opt} = -2 \, b'g \cos(\alpha/2)/(g-b')$$

by at most the factor of 750 μm [g/((g−b')·F)]. The advantages of such focal length conditions correspond to those discussed above with respect to ideal focal length.

In some embodiments, the following applies to the radius of curvature $r_2$ perpendicular to the folding plane:

$$-20 \, b'g \cos(\alpha/2)/(g-b') < r_2 < -0.2 \, b'g \cos(\alpha/2)/(g-b'),$$

where α is a folding angle of the illumination light upon reflection at the respective individual mirror of the first facet mirror. Such a focal length condition takes into account the different imaging conditions in the folding plane and perpendicular to the folding plane.

The disclosure provides an illumination optical unit for EUV projection lithography for illuminating an object field, in which an object to be imaged is arrangeable, with illumination light. The unit includes a first facet mirror and a second facet mirror. The second facet mirror includes a plurality of second facets for imaging portions of the first facet mirror having a typical dimension G into a facet image in the region of the object field. The two facet mirrors have a distance |g| from one another. The second facet mirror has a distance b' from the object field. The facets of the second facet mirror have a focal length f in a plane of incidence of the illumination light on the individual mirrors of the second facet mirror. The following applies to said focal length:

$$[0.1 \, b'g/(g-b')] < f < [10 \, b'g/(g-b')].$$

The second facets of the second facet mirror may be monolithic facets or else individual mirror groups of the second facet mirror. The portion of the first facet mirror to be imaged may likewise relate to monolithic first facets or individual mirror groups. Particularly when embodying the portions of the first facet mirror to be imaged as individual mirror groups, such individual mirror groups may form a virtual first facet which illuminates the object field in the entirety thereof or may illuminate merely a part of the object field. This last variant is used, in particular, if the illumination optical unit is embodied in the style of a specular reflector.

The features discussed above in relation to the imaging effect of the individual mirrors of the first facet mirror may correspondingly also apply in the case of imaging by the second facets. All size relations for focal lengths and radii of curvature discussed above for the individual mirrors of the first facet mirror correspondingly also apply to the second facets of the second facet mirror, but now these relate to imaging the respective portion of the respective first facet mirror into a facet image in the region of the object field.

In particular, an illumination optical unit may include a first facet mirror including individual mirrors, and a second facet mirror including second facets, which respectively meet the conditions in respect of the focal lengths and radii of curvature thereof discussed above.

Advantages discussed above with reference to an illumination optical unit can also be present for: an optical system including an illumination optical unit described herein and a projection optical unit for imaging the object field into an image field; a projection exposure apparatus including such an optical unit and an EUV light source; an illumination system including an illumination optical unit described herein and an EUV light source; a production method of using such a projection exposure apparatus; and a microstructured or nanostructured component produced by such a method.

BRIEF DESCRIPTION OF THE DRAWINGS

Exemplary embodiments of the disclosure are explained in greater detail below with reference to the drawing. In the figures.

DETAILED DESCRIPTION

Figure 1:
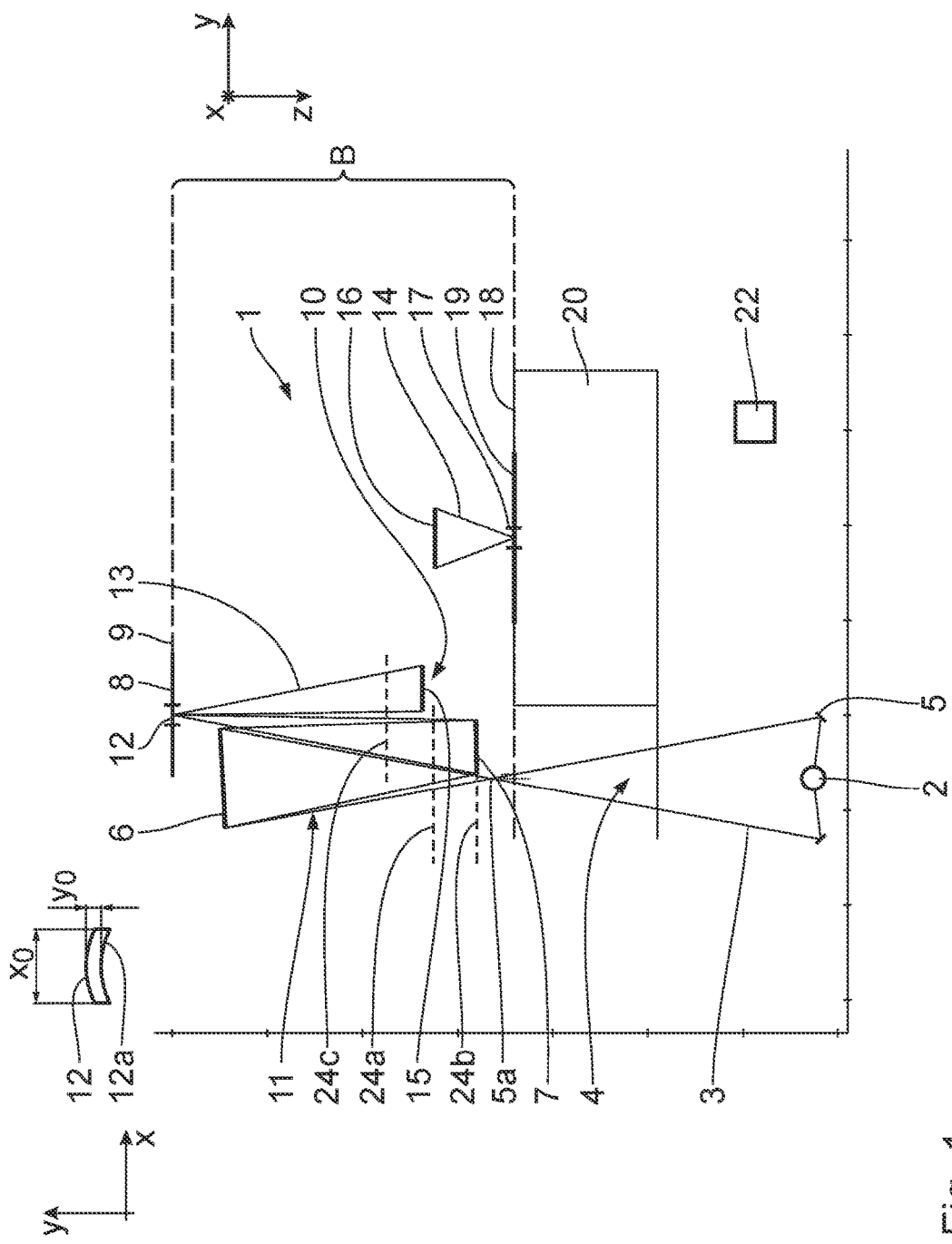
FIG. 1 schematically shows a meridional section through a projection exposure apparatus for EUV projection lithography.

A microlithographic projection exposure apparatus 1, depicted very schematically and in a meridional section in FIG. 1, includes a light source 2 for illumination light 3. The light source 2 is an EUV light source which generates light in a wavelength range between 5 nm and 30 nm. It may be an LPP (laser produced plasma) light source or a DPP (discharge produced plasma) light source.

A transfer optical unit 4 serves to guide the illumination light 3 emanating from the light source 2. The transfer optical unit includes a collector 5, merely depicted in FIG. 1 in respect of its reflective effect, and a transfer facet mirror 6, which is arranged in a field plane of the optical unit of the projection exposure apparatus 1, also referred to as field facet mirror or first facet mirror below and described in more detail below. An intermediate focus 5a of the illumination light 3 is arranged between the collector 5 and the first facet mirror 6. A numerical aperture of the illumination light 3 in the region of the intermediate focus 5a is NA=0.182 in the illustrated embodiment. An illumination-predetermining facet mirror 7, which is likewise still explained in more detail below and also referred to as second facet mirror, is disposed downstream of the first facet mirror 6 and hence downstream of the transfer optical unit 4. A reticle 8, which is arranged in an object plane 9 of a downstream projection optical unit 10 of the projection exposure apparatus 1, is disposed downstream of the illumination-predetermining facet mirror 7 in the beam path of the illumination light 3. The projection optical unit 10 and the projection optical units of the further embodiments described below respectively are a projection lens.

A Cartesian xyz-coordinate system is used below to facilitate the illustration of positional relationships. The x-direction extends perpendicular to the plane of the drawing in FIG. 1 and into the latter. In FIG. 1, the y-direction extends to the right. In FIG. 1, the z-direction extends downwards. The optical components 5 to 7 are constituents of an illumination optical unit 11 of the projection exposure apparatus 1. The illumination optical unit 11 is used to illuminate an object field 12 on the reticle 8 in object plane 9 in a defined manner. The object field 12 has an arcuate or partial circle-shaped form and is delimited by two circular arcs, displaced parallel to one another, with the same radius and two straight side edges which extend in the y-direction with a length $y_0$ and which have a distance of $x_0$ from one another in the x-direction. The aspect ratio $x_0/y_0$ is 13 to 1. An insert in FIG. 1 shows a plan view (not to scale) of the object field 12. An edge form 12a is arcuate. In the case of an alternative and likewise possible object field 12, the edge form thereof is rectangular.

The projection optical unit 10 is merely indicated in part and very schematically in FIG. 1. What is depicted is an object field-side numerical aperture 13 and an image field-side numerical aperture 14 of the projection optical unit 10. Further optical components of the projection optical unit 10 for guiding the illumination light 3 between the optical components 15, 16 are situated between these indicated optical components 15, 16 of the projection optical unit 10, which, for example, may be embodied as mirrors that reflect the EUV illumination light 3.

The projection optical unit 10 images the object field 12 into an image field 17 in an image plane 18 on a wafer 19 which, like the reticle 8 as well, is carried by a holder not depicted in any more detail.

Figure 2:
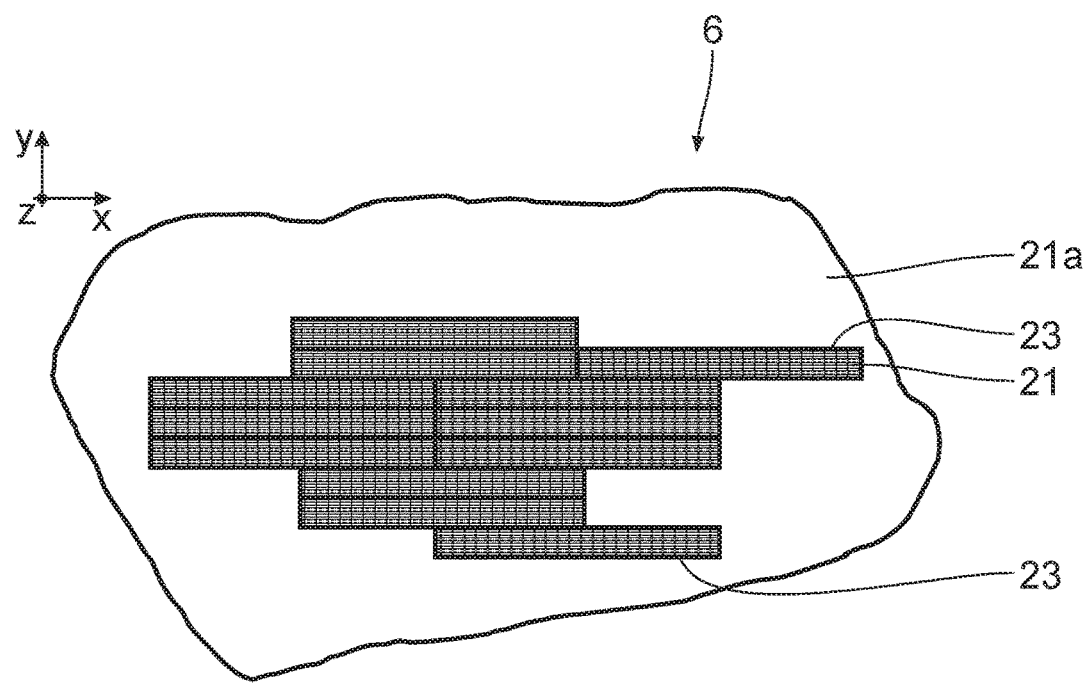
FIG. 2 shows, in a plan view, a portion of an embodiment of a field facet mirror, constructed from individual mirrors, of an illumination optical unit of the projection exposure apparatus according to FIG. 1, including an exemplary grouping of the individual mirrors in an arrangement of individual mirror groups.

The first facet mirror 6 includes a multiplicity of individual mirrors (cf. FIG. 2). Overall, just like the second facet mirror 7 as well, the first facet mirror 6 is embodied as an MMA (micromirror array), in particular as a MEMS (microelectromechanical system) mirror. Each individual mirror 21 may have an area in the range between 100 μm=100 μm and 2 mm ×2 mm. The entire facet mirror 6 or 7 has an extent in the range between 300 mm×300 mm and 700 mm×700 mm. The individual mirrors 21, of which merely a selection is depicted in FIG. 2, are carried by a carrier plate 21a of the first facet mirror 6. Each individual mirror 21 is connected to an actuator in each case, as described in e.g. WO 2009/100 856 A1, for the purposes of an individual deflection of incident illumination light 3. A plurality of individual mirrors 21 may in each case be grouped to form an individual mirror group 23 by way of these actuators and a central control device 22.

Thus, imaging secondary light sources are generated as images of an upstream light source, namely of the intermediate focus 5a, via the first facet mirror 6. Here, the individual mirrors 21 image the intermediate focus 5a into a real image plane 24. This real image plane 24 may coincide with a pupil plane of the illumination optical unit 11; however, this is not mandatory. An illumination intensity distribution in the pupil plane corresponds to an illumination angle distribution of an object illumination by way of the illumination optical unit 11. Depending on the embodiment of the illumination optical unit 11, the second facet mirror 7 is arranged either at a distance from this pupil plane or in the region of this pupil plane. FIG. 1 depicts, in an exemplary manner, various possible arrangements 24a, 24b and 24c of the pupil plane, which are alternatively possible. The pupil plane 24a is arranged in the beam path of the illumination light 3 upstream of the second facet mirror 7. The pupil plane 24b coincides with the arrangement plane of the second facet mirror 7. The pupil plane 24c is arranged in the beam path of the illumination light 3 after reflection at the second facet mirror 7. The individual mirror groups 23 are imaged into the object field 12 in a manner superimposed on one another via second facets of the second facet mirror 7. Here, it is not mandatory for the images of the individual mirror groups 23 to completely cover the object field 12 in each case. As a rule, the images of the individual mirror groups 23 only cover part of the object field 12. A defined, predetermined illumination of the object field 12 arises on the object field 12 from the superposition of the images of all individual mirror groups 23 which are predetermined on the first facet mirror 6.

Figure 3:
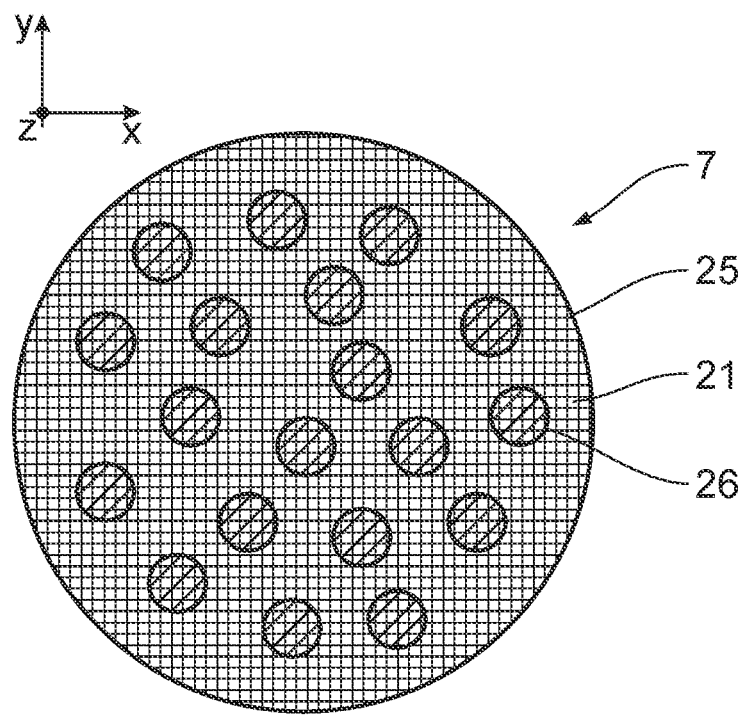
FIG. 3 shows a pupil facet mirror, constructed from a plurality of individual mirrors, of the illumination optical unit, wherein a plurality of individual mirror groups, illuminated in a circular fashion, are illuminated as second facets for predetermining a first illumination setting.

FIG. 3 shows details of the second facet mirror 7 which is used in the projection exposure apparatus 1. The second facet mirror 7 has a round carrier plate 25, on which a multiplicity of individual mirrors 21 are arranged. The carrier plate 25 may also have an elliptic, oval, stadium-shaped or kidney-shaped edge.

Within the edge, the individual mirrors 21 are arranged in a grid-like manner in lines and columns by way of the carrier plate 25. What is described in WO 2009/100 856 A1 applies in relation to the arrangement and actuation by actuators of the individual mirrors 21 of the second facet mirror 7. The individual mirrors 21 of the second facet mirror 7 likewise include actuators and the actuation by way of the control device 22.

The individual mirrors 21 of the second facet mirror 7 may also be combined to form individual mirror groups 26. These individual mirror groups 26 of the second facet mirror 7 guide the illumination light 3 which was reflected by assigned individual mirror groups 23 of the first facet mirror 6 to the object field 12.

By appropriately predetermining the tilt angles of the individual mirrors 21 of the two facet mirrors 6, 7 and by predetermining the group assignment, it is possible to predetermine various illumination settings, i.e. various illumination angle distributions and illumination intensity distributions over the object field 21. By way of example, this predetermination of the illumination setting is described in WO 2010/099 807 A1.

Figure 4:
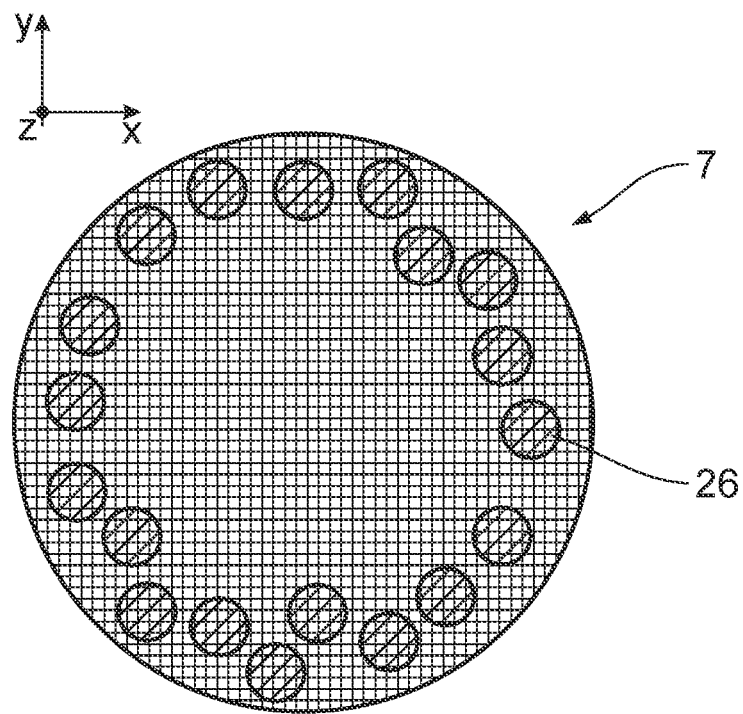
FIG. 4 shows the pupil facet mirror according to FIG. 3, wherein the same number of individual mirror groups is illuminated in a circular fashion for predetermining a further illumination setting.

In an exemplary manner, FIGS. 3 and 4 show an illumination of the second facet mirror 7 by a first facet mirror 6 which, overall, has nineteen individual mirror groups. Illuminated individual mirrors 21 of the second facet mirror 7 are highlighted by shading. Individual mirror groups 26, each with a circular edge, are illuminated here.

Each individual mirror group 26 of the second facet mirror 7 is illuminated by exactly one individual mirror group, i.e., for example, by the individual mirror groups 23 (cf. FIG. 2) of the field facet mirror 6. Overall, nineteen illuminated individual mirror groups 26 are present on the second facet mirror 7. As mentioned previously, the upstream field facet mirror 6 is subdivided into nineteen assigned individual mirror groups 19. A total of nineteen channels for the light path of the EUV radiation 3 from the field facet mirror 6 to the object field 12 emerge by the assignment of the nineteen individual mirror groups 23 of the field facet mirror 6 to the nineteen individual mirror groups 26 on the second facet mirror 7.

In the illumination example according to FIG. 3, the individual mirror groups 26 are arranged with an approximately uniform distribution over the carrier plate 25. Accordingly, an illumination of the object field 12 emerges from illumination angles which are distributed over the whole aperture of the carrier plate 25. Thus, an approximately conventional illumination of the object field 12 from all directions emerges, the directions being predetermined by the image-side numerical aperture of the projection optical unit 10.

FIG. 4 shows an illumination of the second facet mirror 7 which has been modified in relation to FIG. 3, i.e. a changed illumination setting of the projection exposure apparatus 1. Now, individual mirror groups 26 arranged at the edge of the carrier plate 25 are illuminated by an appropriate group-wise actuation of the associated individual mirror groups 23 of the field facet mirror 6. A corresponding annular illumination angle distribution of the illumination of the object field 12 emerges in the object plane 9.

The individual mirrors 21 of the first facet mirror 6 are not planar but have an imaging effect. The latter may be characterized by a focal length of the individual mirrors 21 of the first facet mirror 6 or by a radius of curvature of the reflection surfaces of the respective individual mirrors 21.

Figure 5:
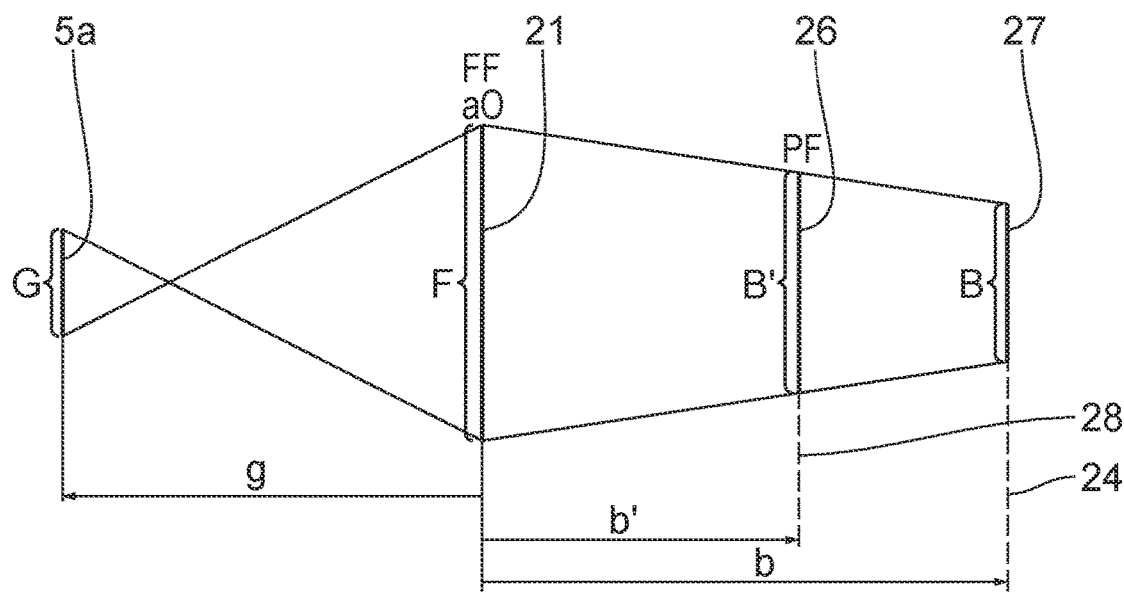
FIG. 5 shows an unfolded schematic illustration for elucidating optical variables of an imaging effect of an individual mirror of the field facet mirror.

FIG. 5 schematically shows optical variables which play a role when imaging the intermediate focus 5a into a secondary light source 27 in the real image plane 24. The secondary light source 27 is imaged into a target plane lying between a field plane and a pupil plane. This is the case, in particular, if the second facet mirror 7 is embodied as a specular reflector, as described in e.g. WO 2009/100 856 A1. Then, the target plane may coincide with the arrangement plane of the specular reflector.

The intermediate focus 5a has a typical diameter G. This typical diameter G is the diameter of a circle, the area of which equals the source area, i.e. the focus area in the case of the intermediate focus 5a.

F denotes the typical diameter of the individual mirror 21 of the first facet mirror 6. The typical diameter F is the diameter of a circle, the area of which equals the area of the individual mirror 21. In fact, the individual mirrors 21 are rectangular, in particular square, trapezoidal or hexagonal; i.e., they have an edge contour which allows the facet mirror to be occupied with a filling factor which is as high as possible.

g denotes an object distance when imaging the intermediate focus 5a into the secondary light source 27. Here, the following applies: g<0. Then, is the distance between the first facet mirror 6 with the individual mirror groups 21 and the intermediate focus 5a.

B denotes the typical diameter of the secondary light source 27.

b denotes the image distance of this image. Here, the following applies: b≥0.

To the extent that an individual mirror group 26 of the second facet mirror 7 is arranged at a distance from the real image plane 24 in an arrangement plane 28 at a distance b' from the imaging individual mirror 21 of the first facet mirror 6, the following applies for a diameter B' of an illumination of this individual mirror group 26:

$$B' = \frac{b'}{b}B + \left(1 - \frac{b'}{b}\right)F \quad (1)$$

Here, the assumption is made that the secondary light source 27 lies downstream of the individual mirror group 26 of the second facet mirror 7 in the beam path of the illumination light 3.

The arrangement plane 28 may be a pupil plane. Then, the individual mirror groups 26 of the second facet mirror are pupil facets.

A minimum diameter B' emerges in the case of a focal length $f_{opt}$ of the individual mirror 21 of the first facet mirror 6:

$$\frac{1}{f_{opt}} = \frac{1}{b'} - \frac{1}{g}$$

Then, the minimum illumination diameter $B'_{opt}$ on the individual mirror group 26 emerges as:

$$B'_{opt} = -b'G/g$$

An actual focal length f of the respective individual mirror 21 of the first facet mirror 6 should deviate from the ideal focal length $f_{opt}$ in accordance with equation (2) above by no more than an image magnification tolerance value a $$\left(f = \frac{1}{1-a}f_{opt}\right),$$

for which the following applies:

$$a = \frac{b'G}{(b'-g)F}\beta \quad (4)$$

Here, β may assume values in the range between 0.1 and 0.3.

The image magnification tolerance value a is a measure for the size of a point image at the image location, i.e. a measure for the diameter of an image of an object field point at the image location. The focal length f of the respective individual mirror 21 should lie in the following range which is dependent on the image magnification tolerance value a:

$$f_{opt}/(1+a) \leq f \leq f_{opt}/(1-a)$$

β from formula (4) above is a measure for the size or the diameter of the point image relative to the size or the diameter of the second facet 26. The point image may be significantly smaller than the diameter of the respective second facet 26. The point image may have a diameter which is less than 50% of the diameter of the second facet 26, less than 40%, less than 30% or else less than 20%.

If typical values for G (10 mm), b' (1000 mm), g (−1000 mm) and F (1 mm) are inserted, a value range of between 0.5 and 1.5 emerges for the relative deviation a (β between 0.1 and 0.3). Overall, the focal length f of the individual mirror 21 of the first facet mirror 6 should lie within the following range limits:

$$[0.1 \ b'g/(g-b')] \leq f \leq [10 \ b'g/(g-b')] \quad (5)$$

Alternatively, a deviation may also be parameterized by way of a magnification tolerance value a'

$$\left(f = \frac{1}{1-a'}f_{opt}\right):$$

$$a' = \frac{g}{(g-b')F}\gamma \quad (6)$$

Here, γ lies in the range between 100 μm and 750 μm.

Figure 6:
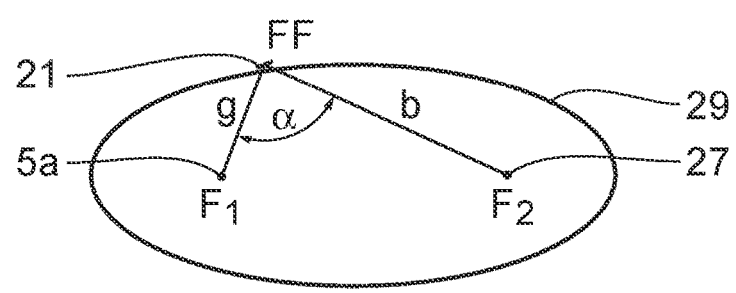
FIG. 6 shows a not unfolded schematic illustration for introducing optical variables when imaging using an individual mirror of the field facet mirror, embodied as an ellipsoid.

In practice, the illumination light 3 is folded with a folding angle α when it is reflected at the respective individual mirror 21 of the first facet mirror 6 in a plane of incidence yz, affecting the image of the intermediate focus 5a. Then, α/2 is the angle of incidence of the illumination light 3 at the respective individual mirror 21. A folding plane is predetermined by the respectively incident and leaving beam at a point of reflection on the individual mirror 21. In FIG. 6, the folding plane coincides with the plane of the drawing.

Ideal imaging of the intermediate focus 5a into the secondary light source 27 emerges if the reflection surface of the individual mirror 21 of the first facet mirror 6 is formed as an ellipsoid, with this applying to exactly one switching position of the individual mirror 21. Such an ellipsoid may be described approximately by two radii of curvature in the plane of incidence yz of the illumination light 3 onto the individual mirror 21 or the folding plane and perpendicular to the folding plane. The ellipsoid may be approximated by a toric surface which, to second order, contacts the ellipsoid. The curvature property of the surface, e.g. at the center of the mirror, is desirable.

If use is made of spherical mirrors, the point image is decisively determined by astigmatism in the case of the small aperture present here.

Blurring Δr of the point image may be described well for folding angles <20° by $$\Delta r = \frac{F}{4}(b'-g)\frac{\alpha^2}{4}$$

Here, Δr describes a typical radial extent of the blurred point image.

FIG. 6 elucidates the conditions in the case of such folding imaging via an ellipsoid surface. $F_1$ and $F_2$ denote the two focal points of the ellipse 29, the ellipse representing a section through the ellipsoid, the part of which is the reflection surface of the individual mirror 21. The intermediate focus 5a lies in the focus $F_1$. The secondary light source 27 lies in the focus $F_2$. The following values emerge for the ideal radii of curvature $r_1$ in the folding plane and $r_2$ perpendicular thereto:

$$r_{1,opt} = r_1 = -\frac{2gb'}{(g-b')\cos(\alpha/2)} \quad (7)$$

and $$r_{2,opt} = r_2 = -\frac{2gb'\cos(\alpha/2)}{g-b'} \quad (8)$$

Once again, the deviation factors β and γ, which were already discussed above, emerge for the deviations of tolerable radii of curvature from these ideal radii of curvature. Corresponding deviations apply for the focal lengths, with the following applying:

$$f_{1,2} = -r_{1,2}/2.$$

Corresponding observations, as were made above for the focal lengths and radii of curvature of the individual mirrors 21 of the first facet mirror 6, may also be made in the same way for the second facets or the individual mirror groups 26 of the second facet mirror 7. One of the first facets or individual mirror groups 23, as an object, is imaged into the object field 12 by way of these second facets 26.

Figure 7:
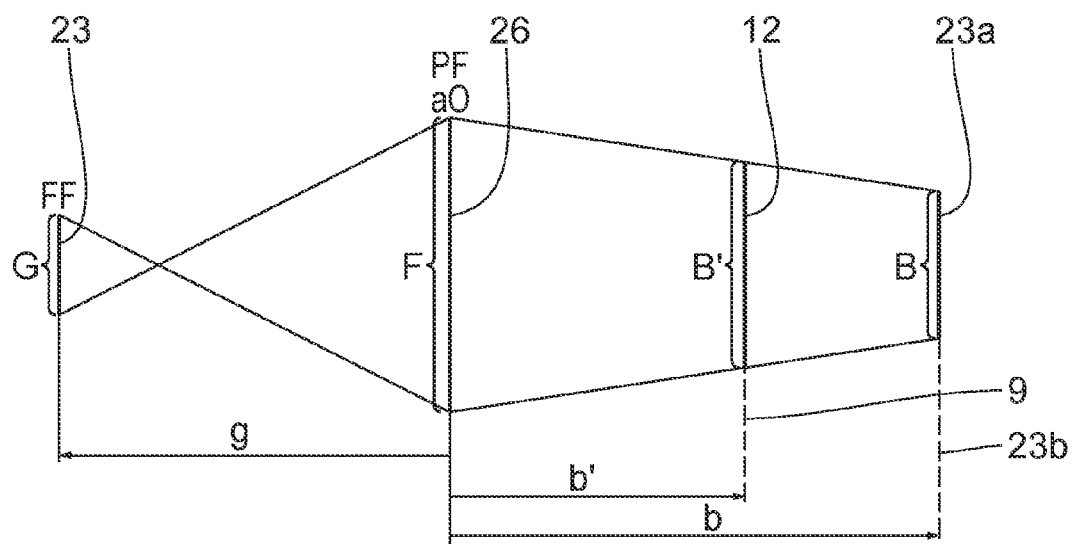
FIG. 7 shows, in an illustration similar to FIG. 5, an elucidation of optical variables of an imaging effect of a pupil facet of the pupil facet mirror.

The imaging conditions for estimating the focal lengths or radii of curvature for the second facets 26 emerge from the schematic illustration according to FIG. 7, which is not true to scale.

Here, G denotes a typical dimension of one of the individual mirror groups 23 of the first facet mirror 6. This individual mirror group 23 represents a portion of the first facet mirror 6, which is imaged in each case into a facet image 23a in a facet image plane 23b in the region of the object plane 9 by a second facet 26 of the second facet mirror 7. The portion of the first facet mirror 6 to be imaged may be a monolithic field facet or else a "virtual" field facet embodied as an individual mirror group. The image of such an individual mirror group 23 of the first facet mirror 6 may cover the entire object field 12 or part thereof. As already explained above, the imaging second facets 26 may in turn be formed by individual mirror groups.

The optical variables playing a role when imaging respectively one of the individual mirror groups 23 of the first facet mirror 6 into the facet image 23a are denoted in the same way in FIG. 7 as in the imaging scheme according to FIG. 5.

The typical dimension G of the individual mirror group 23 denotes the diameter of a circle, the area of which corresponds to the area of the respective individual mirror group 23.

F denotes the typical diameter of one of the second facets 26 of the assigned individual mirror group.

B' denotes a typical extent of the object field 12; i.e., it may once again be considered a diameter of a circle, the area of which corresponds to the area of the object field 12. B denotes the typical diameter of the facet image 23a.

g denotes the object distance of the image of the individual mirror group 23 of the first facet mirror 6 through the individual mirror group 26 of the second facet mirror 7. b' denotes the distance between the individual mirror group 26 of the second facet mirror 7 and the object field 12. b denotes the distance of the individual mirror group 26 of the second facet mirror 7 from the facet image 23a.

Then, what was explained above in conjunction with the focal lengths and the radii of curvature of the individual mirrors 21 of the first facet mirror 6 applies accordingly for estimating the focal lengths and radii of curvature of the second facets 26 or the assigned individual mirror groups of the second facet mirror 7.

A point image between the plane of the individual mirror group 23 of the first facet mirror 6 and the object plane 9 in the y-dimension may be very sharp (a in the region of 0) when using a projection exposure apparatus which scans in the y-direction, i.e. in the plane of incidence of the illumination light 3 on the object in the object field 12. In the x-dimension, a≠0 should apply so that gaps between the individual mirrors 21 of the individual mirror group 23 are not imaged sharply into the object field 12. A lower limit for the point image on the object field 12 in the x-dimension, i.e.

perpendicular to the scanning direction, is a typical dimension of the gaps between individual mirrors 21, adjacent in the x-direction, of the respective individual mirror group 23 of the first facet mirror 6.

The boundary conditions "a≈0 in the scanning direction y" and "a≠0 in the direction x perpendicular to the scanning direction y" may regularly be realized using one and the same radius of curvature of the second facets 26 or of the assigned individual mirror groups of the second facet mirror 7 since an astigmatism emerges on account of the non-perpendicular incidence on the second facet mirror 7, i.e. the refractive power of a spherical mirror not hit perpendicularly therefore having a different value in the x-dimension than in the y-dimension.

Typical absolute range limits for the variables defined above are the following:

2 mm<=G<=10 mm
0.4 mm<=F<=2 mm
2 mm<=B'<=12 mm
0°<=alpha/2<=20°

On the first facet mirror 6, the following applies to the focal lengths $f_1$ (tangential) and $f_2$ (sagittal), the back focal lengths and the radii of curvature (all concave):

−2000 mm<=g<=−1000 mm
1000 mm<=b'<=2000 mm
300 mm<=$f_1$<=1300 mm
−2600 mm<=$r_1$<=−600 mm
350 mm<=$f_2$<=1400 mm
−2800 mm<=$r_2$<=−700 mm

On the second facet mirror 7, the following applies to the focal lengths $f_1$ (tangential) and $f_2$ (sagittal), the back focal lengths and the radii of curvature (all concave):

−2000 mm<=g<=−1000 mm
1000 mm<=b'<=3000 mm
300 mm<=$f_1$<=1600 mm
−3200 mm<=$r_1$<=−600 mm
350 mm<=$f_2$<=1700 mm
−3400 mm<=$r_2$<=−700 mm

The reticle 8 and the wafer 19 are initially provided for producing a microstructured component, in particular a highly integrated semiconductor component, for example a memory chip, with the aid of the projection exposure apparatus 1. Subsequently, a structure on the reticle 8 is projected onto a light-sensitive layer on the wafer 19 with the projection optical unit of the projection exposure apparatus 1. By developing the light-sensitive layer, a microstructure is then generated on the wafer 19 and the microstructured or nanostructured component is generated therefrom.

What is claimed is:

1. An illumination optical unit configured to illuminate an object field with illumination light, the illumination optical unit comprising:
   a first facet mirror; and
   a second facet mirror,
   wherein:
      the illumination optical unit is an EUV lithography illumination optical unit;
      the first facet mirror is configured to generate imaging secondary light sources as images of an upstream light source;
      the first facet mirror comprises a multiplicity of individual mirrors;
      each individual mirror of the first facet mirror comprises a mirror surface that is less than 2 mm×2 mm;
      the first facet mirror is a distance |g| from the light source;
      the two facet mirrors are a distance b' from one another;
      the individual mirrors of the first facet mirror have a focal length f in a plane of incidence of the illumination light on the individual mirrors of the first facet mirror;

[0.1 b'g/(g−b')]≤f≤[10 b'g/(g−b')];

at least some of the individual mirrors have different radii of curvature in the plane of incidence and/or a folding plane;
      the at least some of the individual mirrors have different radii of curvature perpendicular to the folding plane; and
      the following applies to the radius of curvature $r_1$ in the folding plane: −20 b'g/((g−b') cos (α/2))<$r_1$<−0.2 b'g/((g−b') cos (α/2)),
      where α is a folding angle of the illumination light upon reflection at the respective individual mirror of the first facet mirror.

2. The illumination optical unit of claim 1, wherein:
   the upstream light source has a typical diameter G;
   for each individual mirror of the first facet mirror, the mirror surface has a typical diameter F; and
   the focal length f deviates from an ideal focal length $f_{opt}$=b'g/(g−b') by at most a factor of 0.3 b'G/((b'−g) F).

3. The illumination optical unit of claim 1, wherein:
   the upstream light source has a typical diameter G;
   for each individual mirror of the first facet mirror, the mirror surface has a typical diameter F; and
   the focal length f deviates from an ideal focal length $f_{opt}$=b'g/(g−b') by at most the factor of 750 μm [g/((g−b')·F)].

4. The illumination optical unit of claim 1, wherein the radius of curvature $r_1$ deviates from an ideal radius of curvature $$r_{1,opt} = r_1 = \frac{2gb'}{(g-b')\cos(\alpha/2)}$$

by at most the factor of 750 μm [g/((g−b')·F)].

5. The illumination optical unit of claim 1, wherein the following applies to the radius of curvature $r_2$ perpendicular to the folding plane: −20 b'g cos (α/2)/(g−b') <$r_2$<−0.2 b'g cos (α/2)/(g−b').

6. The illumination optical unit of claim 5, wherein the radius of curvature $r_2$ deviates from an ideal radius of curvature $r_{2opt}$=−2 b'g cos (α/2)/(g−b') by at most the factor of 750 μm [g/((g−b')·F)].

7. The illumination optical unit of claim 6, wherein:
   the upstream light source has a typical diameter G;
   for each individual mirror of the first facet mirror, the mirror surface has a typical diameter F;
   the focal length f deviates from an ideal focal length $f_{opt}$=b'g/(g−b') by at most a factor of 0.3 b'G/((b'−g)F); and
   the focal length f deviates from the ideal focal length $f_{opt}$=b'g/(g−b') by at most the factor of 750 μm [g/((g−b')·F)].

8. The illumination optical unit of claim 5, wherein:
   the upstream light source has a typical diameter G;
   for each individual mirror of the first facet mirror, the mirror surface has a typical diameter F;
   the focal length f deviates from an ideal focal length $f_{opt}$=b'g/(g−b') by at most a factor of 0.3 b'G/((b'−g)F); and the focal length f deviates from the ideal focal length $f_{opt}=b'g/(g-b')$ by at most the factor of 750 μm [g/((g-b')·F)].

9. The illumination optical unit of claim 4, wherein:
the upstream light source has a typical diameter G;
for each individual mirror of the first facet mirror, the mirror surface has a typical diameter F;
the focal length f deviates from an ideal focal length $f_{opt}=b'g/(g-b')$ by at most a factor of 0.3 b'G/((b'-g)F); and
the focal length f deviates from the ideal focal length $f_{opt}=b'g/(g-b')$ by at most the factor of 750 μm [g/((g-b')·F)].

10. The illumination optical unit of claim 1, wherein:
the upstream light source has a typical diameter G;
for each individual mirror of the first facet mirror, the mirror surface has a typical diameter F;
the focal length f deviates from an ideal focal length $f_{opt}=b'g/(g-b')$ by at most a factor of 0.3 b'G/((b'-g)F); and
the focal length f deviates from the ideal focal length $f_{opt}=b'g/(g-b')$ by at most the factor of 750 μm [g/((g-b')·F)].

11. An illumination system, comprising:
an EUV light source; and
an illumination optical unit according to claim 1.

12. An optical system, comprising:
an illumination optical unit according to claim 1; and
a projection optical unit configured to image the object field into an image field.

13. An apparatus, comprising:
an EUV light source;
an illumination optical unit according to claim 1; and
a projection optical unit configured to image the object field into an image field, wherein the apparatus is a lithography projection exposure apparatus.

14. A method of using a lithography projection exposure apparatus comprising an illumination system and a projection optical unit, the method comprising:
using the illumination system to illuminate at least a portion of a reticle;
using the projection optical unit to project at least a portion of the illuminated reticle onto a light sensitive material,
wherein the illumination system comprises an illumination optical unit according to claim 1.

15. An illumination optical unit configured to illuminate an object field with illumination light, the illumination optical unit comprising:
a first facet mirror; and
a second facet mirror comprising a plurality of facets configured to image portions of the first facet mirror into a facet image in a region of the object field,
wherein:
the two facet mirrors are a distance |g| from each other;
the second facet mirror is a distance b' from the object field;
the facets of the second facet mirror have a focal length f in a plane of incidence of the illumination light on the individual mirrors of the second facet mirror;

$$[0.1\ b'g/(g-b')] \leq f < [10\ b'g/(g-b')];$$

at least some of the individual mirrors have different radii of curvature in the plane of incidence and/or a folding plane;
the at least some of the individual mirrors have different radii of curvature perpendicular to the folding plane; and
the following applies to the radius of curvature $r_1$ in the folding plane: $-20\ b'g/((g-b')\cos(\alpha/2)) < r_1 < -0.2\ b'g/((g-b')\cos(\alpha/2))$,
where α is a folding angle of the illumination light upon reflection at the respective individual mirror of the first facet mirror.

16. An illumination system, comprising:
an EUV light source; and
an illumination optical unit according to claim 15.

17. An optical system, comprising:
an illumination optical unit according to claim 15; and
a projection optical unit configured to image the object field into an image field.

18. An apparatus, comprising:
an EUV light source;
an illumination optical unit according to claim 15; and
a projection optical unit configured to image the object field into an image field,
wherein the apparatus is a lithography projection exposure apparatus.

19. A method of using a lithography projection exposure apparatus comprising an illumination system and a projection optical unit, the method comprising:
using the illumination system to illuminate at least a portion of a reticle;
using the projection optical unit to project at least a portion of the illuminated reticle onto a light sensitive material, wherein the illumination system comprises an illumination optical unit according to claim 15.

* * * * *

UNITED STATES PATENT AND TRADEMARK OFFICE
CERTIFICATE OF CORRECTION

PATENT NO. : 10,018,917 B2
APPLICATION NO. : 15/435851
DATED : July 10, 2018
INVENTOR(S) : Stig Bieling et al.

It is certified that error appears in the above-identified patent and that said Letters Patent is hereby corrected as shown below:

In the Specification

Column 5, Line 48, delete "100 μm = 100 μm" and insert -- 100 μm × 100 μm --.

Signed and Sealed this
Sixteenth Day of October, 2018

Andrei Iancu
*Director of the United States Patent and Trademark Office*